United States Patent
Akiyama

(10) Patent No.: US 12,451,854 B2
(45) Date of Patent: Oct. 21, 2025

(54) METHOD FOR MANUFACTURING COMPOSITE SUBSTRATE

(71) Applicant: Shin-Etsu Chemical Co., Ltd., Tokyo (JP)

(72) Inventor: Shoji Akiyama, Gunma (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 224 days.

(21) Appl. No.: 17/919,858

(22) PCT Filed: Apr. 6, 2021

(86) PCT No.: PCT/JP2021/014658
§ 371 (c)(1),
(2) Date: Oct. 19, 2022

(87) PCT Pub. No.: WO2021/220737
PCT Pub. Date: Nov. 4, 2021

(65) Prior Publication Data
US 2023/0163744 A1   May 25, 2023

(30) Foreign Application Priority Data
Apr. 30, 2020   (JP) .................. 2020-080805

(51) Int. Cl.
*H03H 3/08* (2006.01)
*C30B 29/30* (2006.01)
(Continued)

(52) U.S. Cl.
CPC .............. *H03H 3/08* (2013.01); *C30B 29/30* (2013.01); *C30B 33/06* (2013.01); *C30B 33/08* (2013.01);
(Continued)

(58) Field of Classification Search
CPC . Y10T 29/42; H03H 3/02; H03H 3/08; H03H 2003/045; H03H 9/02559;
(Continued)

(56) References Cited

U.S. PATENT DOCUMENTS

| | | | |
|---|---|---|---|
| 5,647,932 A | 7/1997 | Taguchi et al. | |
| 8,119,024 B1 * | 2/2012 | Matsushita | C30B 29/30 |
| | | | 252/62.9 PZ |

(Continued)

FOREIGN PATENT DOCUMENTS

| | | |
|---|---|---|
| JP | 55-109015 | 8/1980 |
| JP | 7-38363 | 2/1995 |

(Continued)

OTHER PUBLICATIONS

O'Leary et al, "3-3 connectivity multilayered piezoelectric composites," IEEE Ultrasonics Symposium, 2004, Montreal, QC, Canada, 2004, pp. 1686-1689, vol. 3. (Year: 2004).*

(Continued)

*Primary Examiner* — A. Dexter Tugbang
(74) *Attorney, Agent, or Firm* — Greenblum & Bernstein, P.L.C.

(57) ABSTRACT

A composite substrate capable of improving temperature characteristics while suppressing crack generation and a method for manufacturing such composite substrate is provided. The method for manufacturing composite substrates includes: a step of preparing a piezoelectric material substrate having a rough surface; a step of removing the damaged layer by etching the rough surface of the piezoelectric material substrate using a chemical process; a step of depositing an intervening layer on the rough surface of the piezoelectric material substrate from which the damaged layer has been removed; a step of flattening the surface of the deposited intervening layer; a step of bonding the piezoelectric material substrate to a support substrate having a lower thermal expansion coefficient than the piezoelectric material, with the deposited intervening layer in between; and a step of thinning the piezoelectric material substrate (Continued)

after bonding. Lithium tantalate (LT) or lithium niobate (LN) are suitable as the piezoelectric material.

9 Claims, 6 Drawing Sheets

(51) Int. Cl.
*C30B 33/06* (2006.01)
*C30B 33/08* (2006.01)
*H03H 9/02* (2006.01)
*H03H 9/25* (2006.01)
*H10N 30/072* (2023.01)
*H10N 30/073* (2023.01)

(52) U.S. Cl.
CPC .... *H03H 9/02559* (2013.01); *H03H 9/02574* (2013.01); *H03H 9/25* (2013.01); *H10N 30/072* (2023.02); *H10N 30/073* (2023.02); *Y10T 29/42* (2015.01)

(58) Field of Classification Search
CPC ...... H03H 9/02574; H03H 9/25; H10N 30/08; H10N 30/082; H10N 30/072; H10N 30/073; C30B 29/30; C30B 33/06; C30B 33/08
See application file for complete search history.

(56) References Cited

U.S. PATENT DOCUMENTS

| | | |
|---|---|---|
| 2010/0088868 A1 | 4/2010 | Kando et al. |
| 2012/0086312 A1* | 4/2012 | Kobayashi ........... H10N 30/073 29/25.35 |
| 2018/0151797 A1* | 5/2018 | Akiyama ................ C30B 29/30 |
| 2019/0036505 A1* | 1/2019 | Akiyama ................ H03H 3/08 |
| 2019/0288661 A1 | 9/2019 | Akiyama et al. |
| 2019/0372552 A1 | 12/2019 | Gaudin et al. |
| 2020/0058842 A1 | 2/2020 | Akiyama et al. |

FOREIGN PATENT DOCUMENTS

| | | |
|---|---|---|
| JP | 2011015178 A * | 1/2011 |
| JP | 6250856 | 12/2017 |
| WO | 2009/081651 | 7/2009 |
| WO | 2018/088093 | 5/2018 |

OTHER PUBLICATIONS

Machine Translation of WO 2018/088093, Dec. 2024. (Year: 2024).*
Taiyo Yuden Co., Ltd., "Temperature Compensation Technology for SAW-Duplexer Used in RF Front End of Smartphone", Dempa Shimbun High Technology, Nov. 8, 2012, 4 pages (not including English translation).
Written Opinion of the International Searching Authority in International Patent Application No. PCT/JP2021/014658, dated Jun. 8, 2021, along with an English translation thereof.
International Search Report Issued in International Patent Application No. PCT/JP2021/014658, dated Jun. 8, 2021, along with an English translation thereof.
European Search Report received for EP Application No. 21795789. 3, dated May 6, 2024.
Galinetto et al., "Micro-Raman analysis on LiNbO3 substrates and surfaces: Compositional homogeneity and effects of etching and polishing processes on structural properties". Published in Optics and Lasers in Engineering, Elsevier, vol. 45, Issue 3, pp. 380-384. Published Mar. 2007.

* cited by examiner

|  | As-sliced Ra= 0.68um | Grinding #1700 Ra= 0.19um | Grinding #4000 Ra= 0.09um | Lap GC#1000 Ra= 0.32um | Lap GC#2500 Ra= 0.17um | Lap GC#4000 Ra= 0.12um |
|---|---|---|---|---|---|---|
| No etching | × | × | × | × | × | × |
| Etching 3 hours | × | △ | ○ | × | △ | ○ |
| Etching 6 hours | △ | ○ | ○ | △ | ○ | ○ |
| Etching 9 hours | ○ | ○ | ○ | ○ | ○ | ○ |

○ : No defects
△ : 1 to 20 visible defects on the surface
× : More than 20 visible defects on the surface

FIG. 7

METHOD FOR MANUFACTURING COMPOSITE SUBSTRATE

TECHNICAL FIELD

The present invention relates to a composite substrate used as a material for surface acoustic wave devices and the like, and a manufacturing method thereof.

BACKGROUND ART

In recent years, in the market of mobile communications typified by smartphones, data traffic has been rapidly increased. As the number of required bands is increased to address this problem, it is inevitable that the various components must be made smaller and higher performance. Common piezoelectric materials such as lithium tantalate (LT) and lithium niobate (LN) are widely used as materials for surface acoustic wave (SAW) devices. However, while these materials have a large electromechanical coupling coefficient and the bandwidth of the devices can be broadened, there is a problem that the temperature stability of the materials is low, and so the adaptable frequency is shifted by the temperature change. This is because lithium tantalate or lithium niobate has a very high thermal expansion coefficient.

To reduce this problem, a method has been proposed in which lithium tantalate (LT) or lithium niobate (LN) is bonded to a material with a low thermal expansion coefficient, and the LT or LN side is thinned to several μm to several tens μm by grinding or other means to obtain a composite substrate (composite wafer). A method to reduce thermal expansion of LT and improve temperature characteristics by bonding a support wafer made of a low expansion coefficient material (sapphire, silicon, etc.) has also been proposed (see, for example, Non-Patent Document 1). For reference, the coefficients of thermal expansion of various materials are graphed in FIG. 1.

However, this method has the problem of generating noise, called spurious, in the anti-resonant frequency band due to the stacking of the thin LT film on the support wafer. This noise is caused by reflections from the interface between the LT film and the support wafer. As an example, FIG. 2 shows an actual example of the spectrum of reflection coefficient (S11) in a resonator fabricated from a composite substrate with a 20 μm thick LT film on a silicon substrate. In FIG. 2, the difference between the peaks and dips of the spectrum is defined as spurious intensity (or amplitude).

In order to solve this problem, in the Patent Document 1, the bonding surface of the LT is roughened with loose abrasive grains (lapping process) to obtain a roughness of about 300 nm in Ra, and then bonded to the support wafer via an intervening layer, which successfully suppresses spurious. This method has the advantage that rough surfaces resulting from the processes used in wafer fabrication (slicing, lapping, grinding, etc.) can be used as is.

However, although the method of the Patent Document 1 is extremely effective in suppressing spurious, it has the problem that the filter characteristics deteriorate as the thermal shock test (a test in which the filter is subjected to high and low temperatures in a short period of time), one of the reliability tests, is repeated. FIG. 3 shows an example of thermal shock test results for wafers fabricated by the method of the Patent Document 1 After the thermal shock test, the insertion loss increased and the bandwidth narrowed compared to before the test. Investigation of the cause of this property degradation revealed that one of the causes was cracks extending from the rough surfaces of the LT and intervening layer to the LT film. The cracks sometimes reach the wafer surface. The cracks occur due to the extremely large difference in thermal expansion coefficients between LT and Si, and as the thermal shock is repeated, micro defects in the LT film near the interface between the LT and the intervening layer become cracks, which affect the properties.

On the other hand, it is hard to discard the advantage of using Si, which has a low thermal expansion coefficient, as a support wafer to improve the temperature characteristics (variation of characteristics with temperature) of LT. It is very difficult to achieve both the problem of cracking and the improvement of temperature characteristics.

PRIOR ART REFERENCES

Patent Documents

Patent Document 1: Japanese Patent No. 6250856
[Non-Patent Documents]
Non Patent Document 1: Temperature Compensation Technology for SAW-Duplexer Used in RF Front End of Smartphone, Dempa Shimbun High Technology, Nov. 8, 2012

SUMMARY OF THE INVENTION

Problems to be Solved by the Invention

In view of these problems, it is an object of the present invention to provide a composite substrate capable of improving temperature characteristics while suppressing crack generation and a method for manufacturing such a composite substrate.

Means for Solving the Problems

In order to solve the above problem, the method for manufacturing composite substrates in accordance with the embodiment of the present invention comprises: a step of preparing a piezoelectric material substrate having a rough surface; a step of removing the damaged layer by etching the rough surface of the piezoelectric material substrate using a chemical process; a step of depositing an intervening layer on the rough surface of the piezoelectric material substrate from which the damaged layer has been removed; a step of flattening the surface of the deposited intervening layer; a step of bonding the piezoelectric material substrate to a support substrate having a lower thermal expansion coefficient than the piezoelectric material, with the deposited intervening layer in between; and a step of thinning the piezoelectric material substrate after bonding. Lithium tantalate (LT) or lithium niobate (LN) are suitable as the piezoelectric material. The rough surface may be defined as a surface whose surface roughness is greater than about 0.03 μm in arithmetic mean roughness Ra.

In the present invention, chemical etching with solution may be performed in the step of removing the damaged layer. Alternatively, dry etching may be performed in the step of removing the damaged layer.

In the present invention, it is preferable to apply a surface activation treatment to both or one of the piezoelectric material substrate and the support substrate prior to the step of bonding. The surface activation treatment may be ozone water treatment, UV ozone treatment, ion beam treatment, or plasma treatment.

In the present invention, the intervening layer may include any of $SiO_2$, SiON, SiN, SiC, AlN, $Al_2O_3$, $Y_2O_3$, $TiO_2$, $Ta_2O_5$, and $ZrO_2$.

In the present invention, grinding and/or polishing of the piezoelectric material substrate may be performed in, the step of thinning the piezoelectric material substrate. Alternatively, ion implantation may be applied to the piezoelectric material substrate in advance, and thinning may be performed by peeling at the ion implantation interface in the step of thinning the piezoelectric material substrate after bonding. In this case, the ions to be implanted may contain either $H^+$ or $H_2^+$.

The composite substrate of an embodiment of the present invention is a composite substrate in which a piezoelectric material substrate and a support substrate, whose coefficient of thermal expansion is smaller than that of the piezoelectric material, are bonded together, with an intervening layer in between. In the composite substrate, the interface of the the piezoelectric material substrate with the intervening layer is a rough surface with the damaged layer removed, and the piezoelectric material is lithium tantalate (LT) or lithium niobate (LN). The interface with the support substrate in the intervening layer is a flattened surface. The rough surface may be defined as a surface whose surface roughness is greater than about 0.03 μm in arithmetic mean roughness Ra.

BRIEF DESCRIPTION OF THE DRAWINGS

FIG. 7 shows the evaluation results of each wafer manufactured in Example 3.

DESCRIPTION OF EMBODIMENTS

Hereinafter, embodiments of the present invention will be described in detail, but the present invention is not limited thereto.

Figure 1:
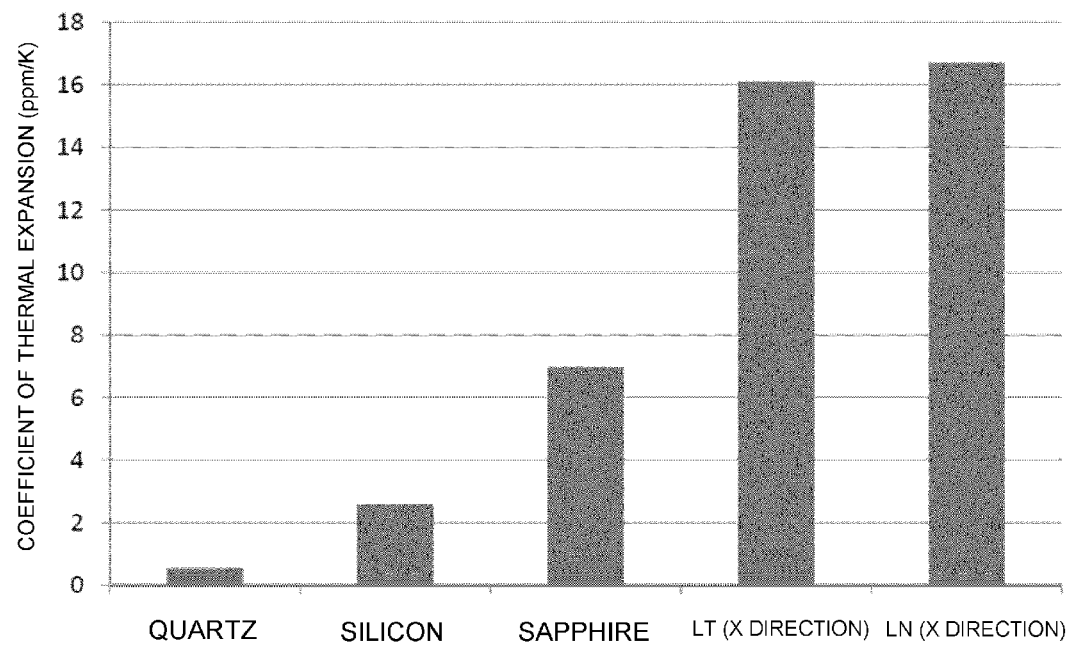
FIG. 1 is a graph showing the coefficients of thermal expansion of various materials in contrast.
Figure 2:
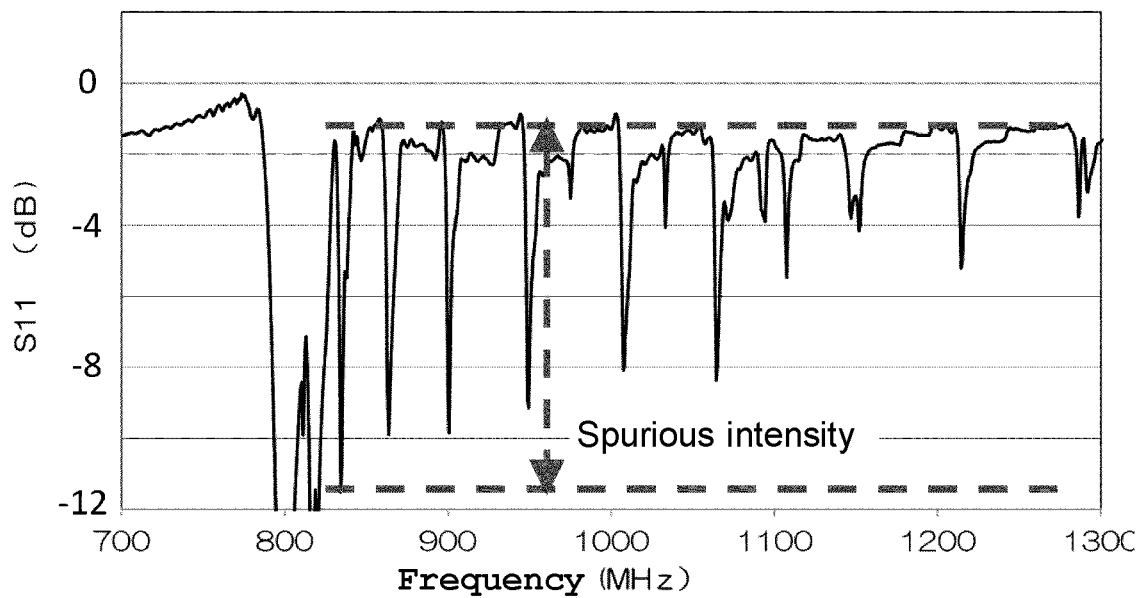
FIG. 2 shows the spectrum of reflection coefficient in a resonator fabricated from a conventional composite substrate.
Figure 3:
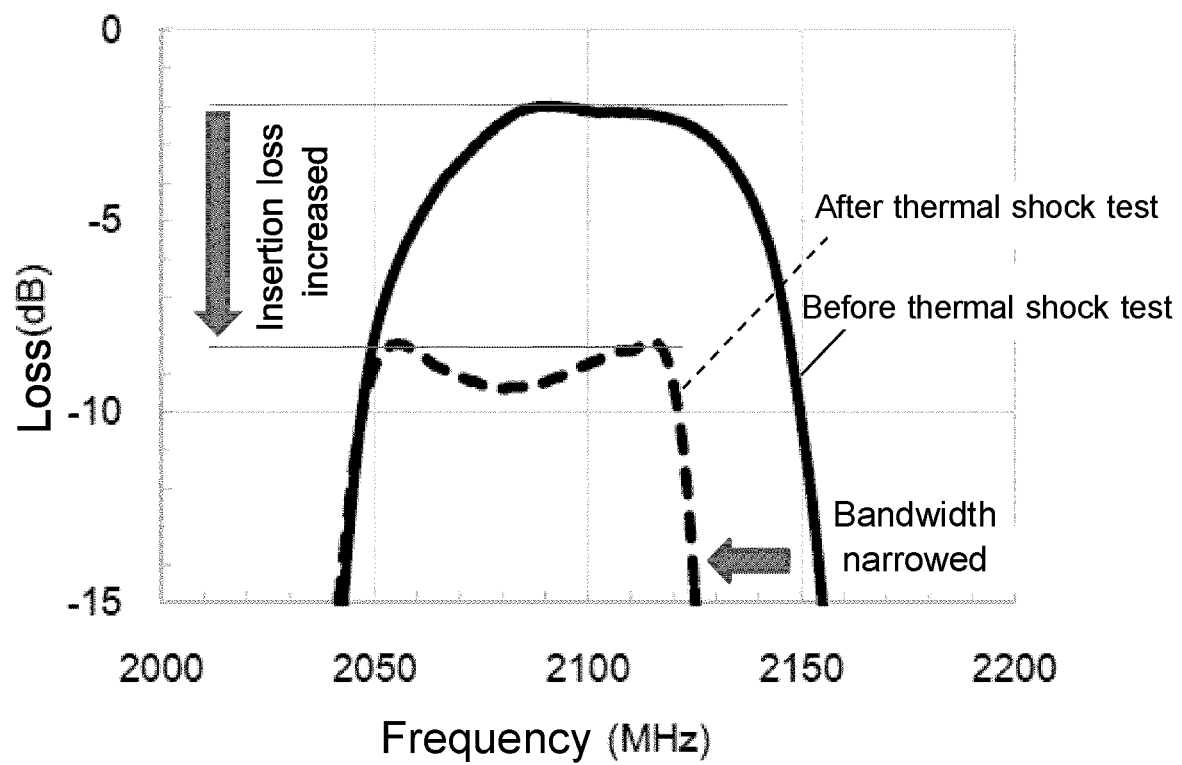
FIG. 3 shows a result of the thermal shock test for wafers fabricated by a conventional method.
Figure 4:
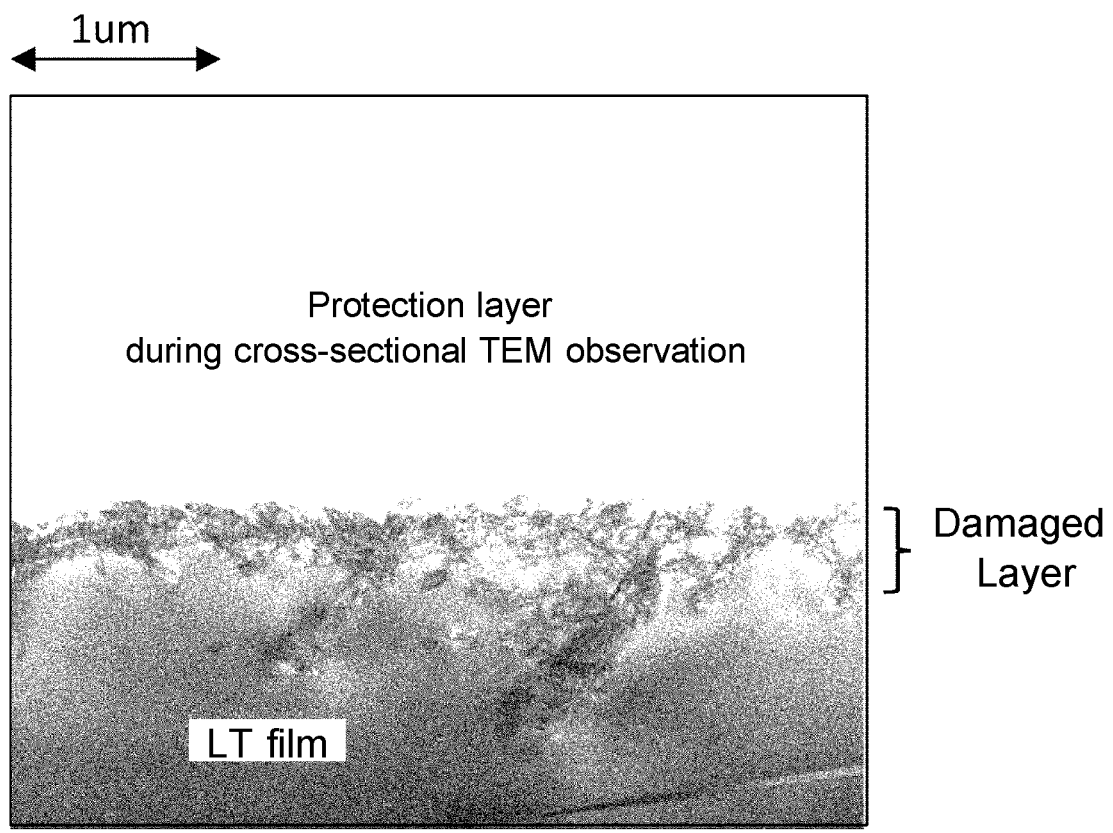
FIG. 4 shows a cross-sectional TEM image of the near surface of an LT wafer roughened by the lapping process.
Figure 5:
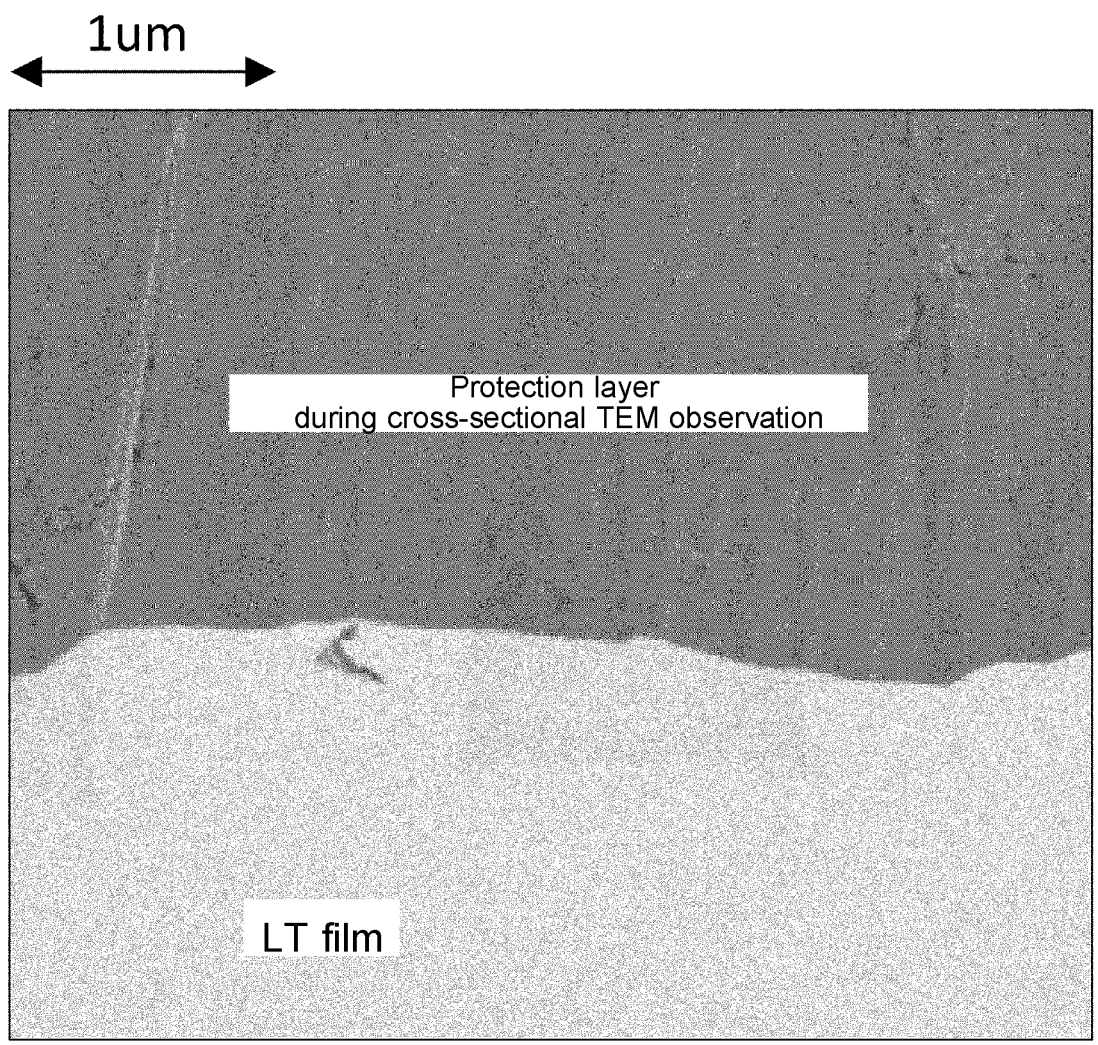
FIG. 5 shows a cross-sectional TEM image of the near surface of an LT wafer after etching.

To solve the problem, the inventor first conducted a detailed investigation of the defects. The sample used was an LT wafer whose surface was lapped with GC (green silicon carbide) grit with particle size #3000. In cross-sectional observation, although they were not clearly visible with the commonly used surface-observation type SEM (Scanning Electron Microscopy), observation with the transmission type TEM (Transmission Microscopy), which can even observe internal crystal defects, revealed the existence of numerous cracks in the vicinity of the surface. The cross-sectional TEM image is shown in FIG. 4. In the present invention, the cracked layer is removed by chemical etching in the vicinity of this cracked surface by a method that does not use mechanical or physical techniques. This reduces cracking. The cross-sectional TEM image after etching is shown in FIG. 5. Then, by bonding after the chemical etching, the composite wafers can be made thermally shock-resistant.

The procedure for manufacturing composite substrate 1 using the present invention is described with reference to FIG. 6.

Figure 6:
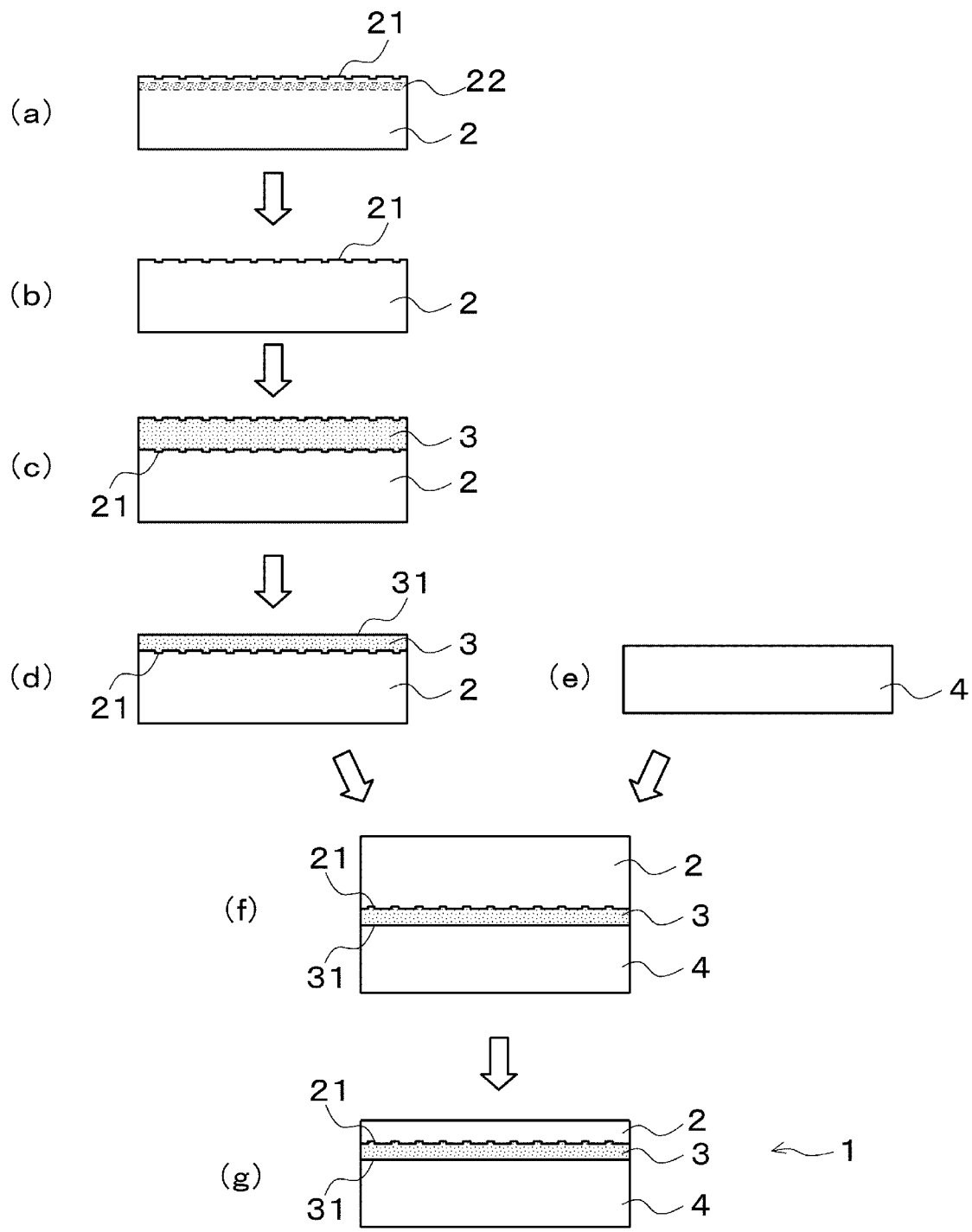
FIG. 6 shows the procedure for manufacturing the composite substrate 1.

First, a piezoelectric material substrate 2 with a rough surface (rough surface) 21 is prepared ((a) in FIG. 6). Lithium tantalate (LT) or lithium niobate (LN) are suitable as the piezoelectric material. The rough surface is, for example, a surface whose surface roughness is greater than about 0.03 μm in arithmetic mean roughness Ra. A damaged layer 22 exists in the vicinity of the rough surface 21. The rough surface 21 of the piezoelectric material substrate is then etched using a chemical process to remove the damaged layer 22 ((b) in FIG. 6). The etching may be done as chemical etching with solution (wet etching) or dry etching. Then, an intervening layer 3 is deposited on the rough surface 21 of the piezoelectric material substrate from which the damaged layer has been removed by etching ((c) in FIG. 6). The intervening layer may include any of $SiO_2$, SiON, SiN, SiC, AlN, $Al_2O_3$, $Y_2O_3$, $TiO_2$, $Ta_2O_5$, and $ZrO_2$. It is preferable if the intervening layer 3 is deposited thick enough to fill the unevenness of the rough surface, and it is even more preferable if it is thick enough to provide sufficient polishing allowance. The surface of the deposited intervening layer 3 becomes a rough surface that follows the rough surface 21 of the piezoelectric substrate 2. The surface of the deposited intervening layer 3 is then flattened to make a bonding surface 31 ((d) in FIG. 6). The flattening method is arbitrary, but for example, flattening by polishing is advisable.

In parallel with preparing the piezoelectric material substrate 2 with the intervening layer 3 as described above, the support substrate 4 is separately prepared ((e) in FIG. 6). The support substrate 4 is a substrate made of a material whose thermal expansion coefficient is smaller than that of the piezoelectric material (LT or LN), for example, Si, sapphire, glass, or quartz is appropriate.

Then, the prepared piezoelectric material substrate 2 and the support substrate 4 are bonded together, with the intervening layer 3 of the substrate 2 in between ((f) in FIG. 6). Prior to the bonding, it is preferable to apply a surface activation treatment to both or one of the piezoelectric material substrate 2 and the support substrate 4. The surface activation treatment may be ozone water treatment, UV ozone treatment, ion beam treatment, plasma treatment, or a combination of these treatments.

The piezoelectric material substrate 2 after bonding is then thinned to obtain composite substrate 1 ((g) in FIG. 6). At this time, for example, the piezoelectric material substrate 2 may be thinned by grinding and/or polishing. Alternatively, ion implantation may be applied to the piezoelectric material substrate in advance at any stage prior to bonding, and thinning may be performed by peeling at the ion implantation interface after the bonding.

EXAMPLES

Example 1

As-sliced (cut from ingot into wafer shape) wafers were prepared and lapped with GC (green silicon carbide) No. 3000 (#3000) abrasive. Then, chemical etching was applied to remove the damaged portions of the surface layer. The solution used for etching was a solution with $HF:HNO_3=2:3$ as described in the Proceedings of the Japan Society of Applied Physics Spring Meeting 11p-D5-7 (2015). A cross-sectional TEM image after etching shown in FIG. 5 reveals that the micro cracks that existed near the surface have disappeared.

Example 2

As-sliced (cut from ingot into wafer shape) wafers were prepared and lapped with GC (green silicon carbide) No. 3000 abrasive. Then, dry etching was applied to remove the damaged portions of the surface layer. The dry etching equipment RIE-10NR manufactured by Samco Inc. was used for dry etching, and a mixture of $CF_4$ and $O_2$ gas was used as etching gas. Observation of the cross-section after etching revealed that, as in Example 1, the micro cracks that existed near the surface disappeared. This indicates that the removal of the damaged layer can be done by any chemical method.

Example 3

Various roughing treatments (as-sliced, grinding wheel #1700, grinding wheel #4000, GC #1000 lap, GC #2500 lap, and GC #4000 lap) were applied to LT wafers. For each roughening level, wafers were produced with the etching of Example 1 for 0, 2, 4, or 6 hours. Then, after each wafer was cleaned, about 6 μm of $SiO_2$ was deposited by chemical vapor deposition (CVD). The surface was subsequently mirror-finished by polishing the surface by 3 to 4 μm after heat treatment at 300° C. The wafers thus obtained and the silicon wafers that are the support wafers are bonded together after plasma activation. Then, after heat treatment at 120° C., the LT wafer side was ground and polished to thin the LT to 10 μm. Each of the wafers thus obtained was subjected to 300 thermal shock tests from −50 to 135 degrees Celsius. In the thermal shock test, the time maintained at each temperature was 10 minutes. The transition time for each temperature was about 15 seconds. The number of defects was then counted visually from the LT side under a focusing light. Note that cracks that have elongated and reached the surface layer become bright spots under the focusing light, which can be visually evaluated. The evaluation results for each wafer are shown in FIG. 7.

From this result, it can be seen that etching can reduce crack-induced defects. It can also be seen that the larger the roughness before etching, the longer the etching process time required to remove the defects.

Example 4

Various roughing treatments (as-sliced, grinding wheel #1500, grinding wheel #4000, GC #1000 lap, GC #3000 lap, and GC #4000 lap) were applied to LT wafers. For each roughening level, wafers were produced with the etching of Example 2 for 0, 10, 20, or 40 minutes. After each wafer was cleaned, about 6 μm of $SiO_2$ was deposited by chemical vapor deposition (CVD). The surface was subsequently mirror-finished by polishing the surface by 3 to 4 μm after heat treatment at 300° C. The wafers thus obtained and the silicon wafers that are the support wafers are bonded together after plasma activation. Then, after heat treatment at 120° C., the LT wafer side was ground and polished to thin the LT to 10 μm. Each of the wafers thus obtained was subjected to 300 thermal shock tests from −50 to 135 degrees Celsius. In the thermal shock test, the time maintained at each temperature was 10 minutes. The transition time for each temperature was about 15 seconds. The number of defects was then counted visually from the LT side under the focusing light. Note that cracks that have elongated and reached the surface layer become bright spots under the focusing light, which can be visually evaluated. The results are almost the same as in FIG. 7, and it was found that removing the damaged layer by a chemical method can improve the characteristics.

Example 5

Various roughing treatments (grinding wheel #1500, grinding wheel #4000, GC #1000 lap, GC #3000 lap, and GC #4000 lap) were applied to LT wafers. For each roughening level, wafers were produced with the etching of Example 1 for 0, 2, 4, or 6 hours. After each wafer was cleaned, about 6 μm of any of $SiO_2$, SiON, SiN, SiC, AlN, $Al_2O_3$, $Y_2O_3$, $TiO_2$, $Ta_2O_5$, and $ZrO_2$ were deposited by physical chemical vapor deposition (PVD). The surface was subsequently mirror-finished by polishing the surface by 3 to 4 μm after heat treatment at 300° C. The wafers thus obtained and the silicon wafers that are the support wafers are bonded together after plasma activation. Then, after heat treatment at 120° C., the LT wafer side was ground and polished to thin the LT to 10 μm. Each of the wafers thus obtained was subjected to 300 thermal shock tests from −50 to 135 degrees Celsius. In the thermal shock test, the time maintained at each temperature was 10 minutes. The transition time for each temperature was about 15 seconds. The number of defects was then counted from the LT side under the focusing light. The results were similar to Example 3. The results show that this method was found to be not sensitive to the type and deposition method of intervening layer.

Example 6

The support wafers were changed to sapphire, glass, and quartz, and wafers were otherwise fabricated and evaluated under the same conditions as in Example 3. In this case, the same tendency as in Example 3 was observed. In other words, etching could reduce crack-induced defects, and the larger the roughness before etching, the longer the etching process time required to remove defects. Thus, this method was found to be not sensitive to the support wafer.

According to the embodiments and examples described above, it can be seen that the manufacturing method for the present invention can be used to obtain a composite substrate in which crack generation is suppressed and temperature characteristics can be improved.

The above embodiments and examples are examples only, and any configuration that is substantially the same as the technical concept described in the claims of the present invention and that produces similar effects is included in the technical scope of the present invention.

REFERENCE SIGNS LIST

1 Composite substrate
2 Substrate
3 Intervening layer
4 Support substrate

The invention claimed is:

1. A method for manufacturing composite substrate comprising:
preparing a piezoelectric material substrate having a first rough surface and a damaged layer in a vicinity of the first rough surface, wherein a surface roughness of the first rough surface is greater than about 0.03 μm in arithmetic mean roughness Ra, and wherein cracks exist within the damaged layer;

removing the damaged layer by etching the first rough surface of the piezoelectric material substrate using a chemical process;

depositing an intervening layer on a second rough surface of the piezoelectric material substrate from which the damaged layer has been removed, wherein a surface roughness of the second rough surface is greater than about 0.03 μm in arithmetic mean roughness Ra;

flattening a surface of the deposited intervening layer;

bonding the piezoelectric material substrate to a support substrate having a lower thermal expansion coefficient than the piezoelectric material substrate, wherein the deposited intervening layer is in between the piezoelectric material substrate and the support substrate; and thinning the piezoelectric material substrate after bonding the piezoelectric material substrate to the support substrate, wherein the piezoelectric material substrate is Lithium tantalate (LT) or lithium niobate (LN).

2. The method for manufacturing composite substrate as claimed in claim 1, wherein chemical etching with solution is performed in the removing the damaged layer.

3. The method for manufacturing composite substrate as claimed in claim 1, wherein dry etching is performed in the removing the damaged layer.

4. The method for manufacturing composite substrate as claimed in claim 1, wherein a surface activation treatment is applied to both or one of the piezoelectric material substrate and the support substrate prior to the bonding.

5. The method for manufacturing composite substrate as claimed in claim 4, wherein the surface activation treatment is any one of ozone water treatment, UV ozone treatment, ion beam treatment, and plasma treatment.

6. The method for manufacturing composite substrate as claimed in claim 1, wherein the intervening layer includes any one of $SiO_2$, SiON, SiN, SiC, AlN, $Al_2O_3$, $Y_2O_3$, $TiO_2$, $Ta_2O_5$, and $ZrO_2$.

7. The method for manufacturing composite substrate as claimed in claim 1, wherein grinding and/or polishing of the piezoelectric material substrate is performed in the thinning the piezoelectric material substrate.

8. The method for manufacturing composite substrate as claimed in claim 1, wherein ion implantation is applied to the piezoelectric material substrate in advance, and the thinning is performed by peeling at an ion implantation interface.

9. The method for manufacturing composite substrate as claimed in claim 8, wherein the ions to be implanted contain either $H^+$ or $H_2^+$.

* * * * *